United States Patent [19]

Massies et al.

[11] 4,211,587

[45] Jul. 8, 1980

[54] PROCESS FOR PRODUCING A METAL TO COMPOUND SEMICONDUCTOR CONTACT HAVING A POTENTIAL BARRIER OF PREDETERMINED HEIGHT

[75] Inventors: Jean Massies; Tronc L. Nuyen, both of Paris, France

[73] Assignee: Thomson-CSF, Paris, France

[21] Appl. No.: 974,547

[22] Filed: Dec. 29, 1978

[30] Foreign Application Priority Data

Dec. 29, 1977 [FR] France .................. 77 39609

[51] Int. Cl.² ............... H01L 21/26; H01L 21/66
[52] U.S. Cl. ................ 148/187; 148/1.5; 357/15; 427/84
[58] Field of Search ............ 148/1.5, 187; 357/15; 427/84

[56] References Cited

U.S. PATENT DOCUMENTS

| | | | |
|---|---|---|---|
| 3,069,604 | 12/1962 | Ruehrwein | 317/234 |
| 3,468,659 | 9/1969 | Belasco et al. | 75/134 |
| 3,897,275 | 7/1975 | Borrelo et al. | 148/1.5 |
| 3,904,449 | 9/1975 | DiLorenzo et al. | 148/175 |
| 3,964,084 | 6/1976 | Andrews, Jr. et al. | 357/15 |
| 3,968,019 | 7/1976 | Hanazono et al. | 204/192 |
| 4,037,197 | 7/1977 | Raychaudhuri | 136/89 CD |
| 4,045,248 | 8/1977 | Shannon et al. | 148/1.5 |
| 4,075,651 | 2/1978 | James | 357/22 |
| 4,110,488 | 8/1978 | Risko | 427/84 |
| 4,116,722 | 9/1978 | Kamei et al. | 148/1.5 |

FOREIGN PATENT DOCUMENTS

| | | |
|---|---|---|
| 1551456 | 12/1968 | France . |
| 2330078 | 12/1974 | France . |
| 967678 | 8/1964 | United Kingdom . |
| 1052379 | 12/1966 | United Kingdom . |
| 1374333 | 11/1974 | United Kingdom . |

OTHER PUBLICATIONS

Duraev et al., "... Non-rectifying Contacts ... GaAs", Instruments and Exp. Techniques, Nov.-Dec. (1969), 1596-1597.
Miyao et al., "A Method of Cleaning $Ga_{0.5}Al_{0.5}Sb$ ...", Jour. Appl. Phys. 48 (Mar. 1977), 1383.

*Primary Examiner*—L. Dewayne Rutledge
*Assistant Examiner*—Upendra Roy
*Attorney, Agent, or Firm*—Oblon, Fisher, Spivak, McClelland & Maier

[57] ABSTRACT

A process for producing a "metal to compound semiconductor" contact having a potential barrier of predetermined height. By this is meant a Schottky contact or an ohmic contact. The process comprises, before deposition of the metal, perfectly cleaning the semiconductor so as to remove in particular oxygen, then depositing sulphur or selenium on its surface by the action of hydrogen sulphide or hydrogen selenide, and, after deposition of the metal, effecting a heat treatment of the contact. In this way, an ohmic contact is obtained. The Schottky contact is obtained by the action of hydrogen sulphide or hydrogen selenide and then pure oxygen at very low pressure.

9 Claims, 2 Drawing Figures

PROCESS FOR PRODUCING A METAL TO COMPOUND SEMICONDUCTOR CONTACT HAVING A POTENTIAL BARRIER OF PREDETERMINED HEIGHT

The invention relates to a process for producing a "metal to compound semiconductor" contact having a potential barrier of pre-determined height. This is intended to mean either a contact of the SCHOTTKY type, whose barrier height is from 0.5 to 0.8 eV, or an ohmic contact whose barrier height is null.

At the present time, as concerns the ohmic contacts, several technological processes are known and in particular those based on the creation between the metal and the semiconductor of a very highly doped layer of the semiconductor (of the n+ type in the case of an n-type semiconductor). This layer is obtained by one of the following processes:

deposition of said layer by epitaxy;

implantation of ions of doping impurities starting at the surface of the semiconductor concerned;

diffusion of impurities brought in by the metal deposited on the semiconductor;

the formation of an alloy between the metal and the semiconductor, achieved by first heating the assembly of the metal and the semiconductor until the metal melts (for example an eutectic of gold, germanium and nickel) and subsequent solution of the fraction of the semiconductor in the molten metal, then a cooling of the whole, which sometimes produces a harmful recrystallization of the semiconductor.

All these methods have at least one drawback owing to the predominating influence of the prior cleanness of the surface of the semiconductor over the qualities of reproducibility and reliability of the ohmic contact.

As concerns the SCHOTTKY contacts, no method is known that produces a contact having a potential barrier of predetermined height.

According to the invention, there is provided a process for producing a "metal-semiconductor" contact including the deposition of a metal on the surface of a n-type semiconductor material, comprising a first preliminary step wherein the semiconductor material is introduced in a chamber where vacuum is created and a second preliminary step wherein hydrogen sulphide or selenide at a low pressure is introduced in said chamber.

According to another aspect of the invention, there is provided a process for producing a "metal-semiconductor" contact including the deposition of a metal on the surface of a n-type semiconductor material, comprising a first preliminary step wherein oxygen is entirely removed from the surface of the semiconductor material and a second preliminary step wherein the semiconductor material is introduced in an aqueous solution of hydrogen sulphide or selenide.

According to another aspect of the invention, there is provided a process for producing a "metal-semiconductor" contact including the deposition of a metal on the surface of a n-type semiconductor material, comprising a first preliminary step wherein the semiconductor material is introduced in a chamber where vacuum is created, a second preliminary step wherein hydrogen sulphide or selenide at a low pressure is introduced in said chamber, and a third preliminary step wherein hydrogen sulphide or selenide is replaced by oxygen at a low pressure.

According to another aspect of the invention, there is provided a process for producing a "metal-semiconductor" contact including the deposition of a metal on the surface of a n-type semiconductor material, comprising a first preliminary step wherein oxygen is entirely removed from the surface of the semiconductor material, a second preliminary step wherein the semiconductor material is introduced in an aqueous solution of hydrogen sulphide or selenide, and a third preliminary step wherein the semiconductor material is introduced in an aqueous solution of oxygen.

The invention will be better understood, and other features will appear, from the ensuing description with reference to the accompanying drawing in which.

Figure 1:
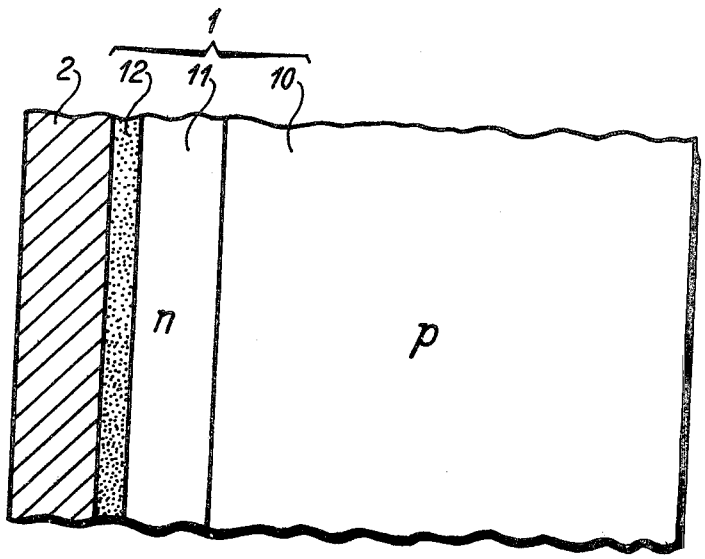
FIG. 1 represents a diagrammatic section of an embodiment of an ohmic contact structure according to the invention.

In a first example, the process according to the invention will be described in starting with the semiconductor part of the structure shown in FIG. 1.

A specimen 1 of gallium arsenide comprises a p-doped subtstrate 10 and an n-doped layer 1. An ohmic contact is desired to be produced on the surface of the layer n. According to the invention, the following steps are carried out:

(a) In a first preliminary step, the semiconductor material is introduced in a chamber wherein vacuum is then created;

(b) In a second preliminary step, hydrogen sulphide or selenide at a low pressure is introduced in the chamber;

(c) A layer 2 of metal is deposited;

(d) The process is completed by an annealing heat treatment.

Preliminary steps (a) and (b) require an extremely thorough prior cleaning of the specimen. It is carried out, for example, in a vacuum chamber which is equipped for effecting the low energy ionic bombardment (for example with ions of argon of 500 eV) of a target, such as the surface of the layer n to be cleaned. The surface of the layer n is first slightly pickled for example by using an ionic bombardment density of 4 /$\mu$A/cm$^2$ for about ten minutes. Thereafter, ultra-vacuum conditions are created in the chamber, for example a residual pressure at the most equal to $10^{-10}$ Torr. Hydrogen sulphide or hydrogen selenide is then introduced into the chamber, which is equivalent to the introduction of an S or Se doping agent in the gaseous form.

The introduction of the gas is stopped when the pressure has risen to at least $10^{-6}$ Torr, and the doping agent is allowed to act for a sufficient time to complete the "adsorption" of sulphur or selenium in the layer n, for example five minutes.

In a variant of the process according to the invention, the procedure employed is chemical in an aqueous solution. Prior to doping with S or Se, the surface to be treated has all traces of oxide or contamination removed therefrom by, for example, carrying out the following operations:

successive ultrasonic cleanings in various very pure solvents for five minutes for each solvent;

picking in a chemical solution, namely in the case of Ga As an $H_2O$ solution (10 ml), $H_2O_2$ solution (10 ml)

H$_2$SO$_4$ solution (60ml) at 105° C. or 110° C. for two minutes;

successive rinsings in various very pure solvent in an ultrasonic radiation for five minutes per solvent.

The doping with S or Se is carried out by plunging the specimen for a sufficient time, for example five minutes, in an H$_2$S or H$_2$Se solution. This solution is prepared by bubbling gas in de-ionized water.

After a further cleaning (without picking) of the specimen, the latter is ready for the following step.

Step (c) comprises a deposition of metal by a conventional method, for example by evaporation under a vacuum of a metal such as gold or silver, possibly an alloy. It is also possible to employ sputtering or an electrochemical deposition method.

Step (d) is an annealing heat treatment at a temperature which facilitates the diffusion of the sulphur or selenium in the semiconductor without, however, melting the metal. In the case of gold, deposited on GaAs n-doped with a concentration of doping impurities of $10^{16}$ atoms per cm$^3$, the annealing temperature is 320° C. and the treating time is about ten minutes.

Generally, the treatment of an Au-Ga As contact is carried out between 300° C. and 350° C.

In the case of InP, the chemical picking will be carried out by maintaining the specimen in 3% brominated a alcohol for one minute at room temperature. The annealing treatment would be carried out under the same conditions as for GaAs when the metal is gold.

At the indicated annealing temperatures, the metal is not melted and consequently no harmful recrystallization phenomenon is to be observed.

With reference again to FIG. 1, it is found that, after treatment, the layer n has a highly n+ doped part constituting an interface 12 between the metal 2 and galliumarsenide. This additional doping consists of S or Se.

Figure 2:
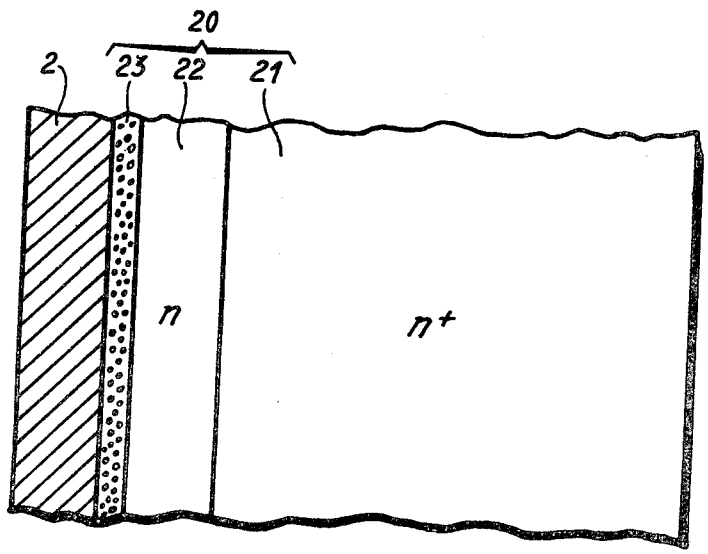
FIG. 2 represents a diagrammatic section of an embodiment of a Schottky contact structure according to the invention.

In another example the process according to the invention will be described in starting with the semiconductor part of the structure shown in FIG. 2.

A specimen 20 of gallium arsenide has an n+-doped substrate 21 and an n-doped layer 22. A Schottky contact is desired to be obtained on the surface of the layer n. According to the invention, the following treatments are effected:

(a') in the course of a preliminary step, there is effected a deposition of suphur or selenium and then oxygen thus forming a layer 23;

(b) there is effected the deposition of metal thus forming a layer 2;

(c) there is effected the annealing as in step (d) of the preceding example.

The step (a') comprises a prior cleaning identical to that of step (a) of the first example. Then ultra-vacuum conditions are created in the chamber, for example a residual pressure of around $10^{-10}$ Torr. Hydrogen sulphide or hydrogen selenide is introduced into the chamber until the residual pressure rises to about $10^{-6}$ Torr. The hydrogen sulphide or hydrogen selenide is maintained in contact with the specimen for a time $\Delta t_1$ at the end of which the hydrogen sulphide or hydrogen selenide is pumped so as to return to the pressure of $10^{-10}$ Torr. A similar operation is then carried out with pure oxygen while maintaining this gas in contact with the specimen for a time $\Delta t_2$.

The times $\Delta t_1$ and $\Delta t_2$ are determined by trial and error in the course of successive manufacturing trials in respect of a Schotty contact speciman having a potential barrier which is between 0.5 and 0.8 eV.

A possible explanation of the results of the process according to invention is the following. The oxygen is a "deep" donor in semiconductors of type III–V, in particular in Ga As in which its ionization energy is 0.75 eV. Its coefficient of diffusion in Ga As is high and it is probable that the same is true with the other III–V semiconductors. Consequently, if there is oxygen at the metal-semiconductor interface, this oxygen is diffused inside the semiconductor. There is then obtained a kind of junction in which the part doped with the oxygen has a Fermi level which is higher than in the non doped part, with a rather extensive connection interface in which the tunnel effect has a low probability of occurring and therefore a contact of the Schottky type. As a consequence of the hereabove explanation:

(i) In the case where it is desired to obtain an ohmic contact, the process according to invention eliminates the oxygen which is naturally present on the surface of the material and then protects the semiconductor with a subsequent doping with oxygen by deposition on its surface of the sulphur or selenium which will only slightly diffuse in the material in the course of the annealing heat treatment. The layer n+ thus produced gives an excellent ohmic contact.

(ii) In the case where it is desired to obtain a Schottky contact, the adsorption of a limited amount of sulphur or selenium and then oxygen is facilitated.

In the latter case, there is obtained a more or less strong oxygen doping and consequently a Fermi level which is more or less high in the n-doped semiconductor material acting as a support for the layer n+.

In both cases, the contacts produced in accordance with the invention may comprise a metal other than gold, for example steel, aluminium, tin, indium, and alloys thereof, by varying the annealing temperature in accordance with the melting point of the chosen metal.

With silver and n-doped gallium arsenide, it is possible to obtain, depending of the prior treatment, either an ohmic contact or a Schottky contact.

The invention is applicable to chemical compounds comprising the elements III–V such as:

GaAs, GaP, GaSb
InAs, InP, InSb
GaAs$_x$P$_{1-x}$, Ga$_x$In$_{1-x}$As, Ga$_x$Al$_{1-x}$As
Ga$_x$In$_{1-x}$As$_y$P$_y$
for
$0 \leq x \leq 1$
$0 \leq y \leq 1$

What is claimed is:

1. A process for producing a "metal to compound semiconductor" contact including the deposition of a metal on the surface of a n-type semiconductor material, comprising a first preliminary step wherein oxygen is entirely removed from the surface of the semiconductor material and a second preliminary step wherein the semiconductor material is treated in an aqueous solution of hydrogen sulphide or selenide.

2. A process for producing a metal to compound semiconductor contact including the deposition of a metal on the surface of a n-type semiconductor material, comprising a first preliminary step wherein oxygen is entirely removed from the surface of the semiconductor material, a second preliminary step wherein the semiconductor material is treated in an aqueous solution of hydrogen sulphide or selenide, and a third preliminary step wherein the semiconductor material is treated in an aqueous solution of oxygen.

3. A process for producing a "metal to compound semiconductor" contact, comprising the following steps:
   (a) operating in a vacuum chamber, cleaning by ionic means the surface of a compound semiconductor specimen to remove the impurities including oxygen traces;
   (b) creating ultra-vacuum conditions in said chamber, then introducing a hydrogen sulphide or hydrogen selenide in gaseous phase until the pressure rises to about $10^{-6}$ Torr;
   (c) depositing a metal layer by a conventional method;
   (d) heat treating said semiconductor specimen.

4. A process as claimed in claim 3, wherein at step (a) the cleaning is carried out using ions of argon of 500 eV with a density of $4/\mu A/cm^2$ for about ten minutes.

5. A process as claimed in claim 3, wherein the metal deposited at step (c) is gold and the heat treatment at step (d) is carried out at a temperature from 300° C. to 350° C. for ten minutes.

6. A process for producing a Schottky contact on a compound semiconductor specimen, comprising the following steps:
   (a) operating in a vacuum chamber, cleaning the surface of said specimen to remove the impurities including oxygen traces;
   (b) creating ultra-vacuum conditions in said chamber, then introducing hydrogen sulphide or selenide in gaseous phase until the pressure rises to about $10^{-6}$ Torr;
   (c) after a space of time $\Delta t_1$, pumping the gaseous phase so as to restore the ultra-vacuum conditions, then introducing pure oxygen until the pressure rises to about $10^{-6}$ Torr and maintaining this gas in contact with the specimen for a time $\Delta t_2$, then pumping the gas to restore the ultra-vacuum conditions;
   (d) depositing a metal layer onto the specimen by a conventional method;
   (e) heat treating the specimen.

7. A process as claimed in claim 6, wherein at step (a) the cleaning is carried out using ions of argon.

8. A process as claimed in claim 6, wherein the metal deposited at step (c) is gold and the heat treatment at step (d) is carried out at a temperature of from 300° C. to 350° C. for ten minutes.

9. A process as claimed in claims 1, 2, 3 or 6, wherein the metal deposited is gold, silver, aluminium, indium, or alloys thereof, the semiconductor material being one of the following chemical compounds:
   GaAs, GaP, GaSb
   InAs, InP, InSb
   $GaAs_xP_{1-x}$, $Ga_xIn_{1-x}As$, $Ga_xAl_{1-x}As$
   $Ga_xIn_{1-x}As_yP_y$
   for
   $0 \leq x \leq 1$
   $0 \leq y \leq 1$.

* * * * *